United States Patent
Izumi et al.

(10) Patent No.: US 7,131,053 B2
(45) Date of Patent: Oct. 31, 2006

(54) NORMALIZING DEVICE AND METHOD, PROGRAM, RECORDING MEDIUM ON WHICH THE PROGRAM IS RECORDED AND COMMUNICATION TERMINAL FOR NORMALIZING DATA

(75) Inventors: Takashi Izumi, Tokyo (JP); Taku Nagase, Tokyo (JP); Noboru Oki, Saitama (JP)

(73) Assignee: Sony Corporation, Tokyo (JP)

( * ) Notice: Subject to any disclaimer, the term of this patent is extended or adjusted under 35 U.S.C. 154(b) by 304 days.

(21) Appl. No.: 10/478,766

(22) PCT Filed: May 22, 2002

(86) PCT No.: PCT/JP02/04959

§ 371 (c)(1),
(2), (4) Date: Nov. 20, 2003

(87) PCT Pub. No.: WO02/095954

PCT Pub. Date: Nov. 28, 2002

(65) Prior Publication Data

US 2004/0158792 A1 Aug. 12, 2004

(30) Foreign Application Priority Data

May 22, 2001 (JP) .............................. 2001-152886

(51) Int. Cl.
*H03M 13/03* (2006.01)

(52) U.S. Cl. ..................................................... 714/794

(58) Field of Classification Search ................ 375/147; 714/755
See application file for complete search history.

(56) References Cited

U.S. PATENT DOCUMENTS

| 6,965,630 B1* | 11/2005 | Miller et al. ................. 375/130 |
| 2002/0097785 A1* | 7/2002 | Ling et al. .................. 375/147 |
| 2003/0056166 A1* | 3/2003 | Kim et al. ................... 714/755 |

(Continued)

FOREIGN PATENT DOCUMENTS

EP 1 081 866 3/2001

(Continued)

OTHER PUBLICATIONS

Iwakiri N: "Interference reduction efficiency of a turbo coded CDMA multilayer system equipped with a pilot canceler" Proc. Vehicular Technology Conference, vol. 1, Sep. 19, 1999, pp. 391-395, XP010352887 Amsterdam, The Netherlands ISBN: 0-7803-5435-4.

(Continued)

*Primary Examiner*—Guy Lamarre
*Assistant Examiner*—Sam Rizk
(74) *Attorney, Agent, or Firm*—Frommer Lawrence & Haug LLP; William S. Frommer; Thomas F. Presson (57) ABSTRACT

Provides a normalizing apparatus that normalizes input signals to a turbo decoder without significantly increasing a size of a circuit. An input signal buffer (341) obtains a sum S for N pieces of input signal data I(i). An input data averaging part (342) obtains an average A by dividing the sum S by the number of data N. A divider (343) obtains normalized data I(i)/A by dividing the input signals I(i) by the average A. A weighting part (345) multiplies the normalized data I(i)/A with a weighting coefficient α, which is determined based on a ratio of a number of input data and a number of output data in rate matching. As a result, the normalization is made possible. Because a signal receiving quality does not need to be determined, an increase in circuit size is inhibited.

8 Claims, 7 Drawing Sheets

U.S. PATENT DOCUMENTS

2003/0081658 A1* 5/2003 Messier et al. ............ 375/147
2003/0142727 A1* 7/2003 Monogioudis et al. ...... 375/147
2004/0013169 A1* 1/2004 Kanemoto et al. ......... 375/147

FOREIGN PATENT DOCUMENTS

| JP | 2000-269934 | 9/2000 |
|----|-------------|--------|
| JP | 2002-76920  | 3/2002 |
| JP | 2002-152295 | 5/2002 |

OTHER PUBLICATIONS

Fuyun Ling: "Optimal turbo decoding metric generation in a pilot assisted coherent wireless communication system" Proc. Vehicular Technology Conference 2000, Piscataway, NJ, USA, vol. 1, Sep. 24, 2000, pp. 298-302, XP010525180 ISBN: 0-7803-6507-0.

Mark. C. Reed and John Asenstorfer: "A Novel Variance Estimator for Turbo-Code Decoding" Proceedings of Int. Conf. on Telecommunications, Apr. 1997, pp. 173-178, XP002362580 Melbourne, Australia.

Summers T A et al: "SNR mismatch and online estimation in turbo decoding" IEEE Transactions on Communications, IEEE Service Center, Piscataway, NJ, US, vol. 46, No. 4, Apr. 1998, pp. 421-423, XP002154486 ISSN: 0090-6778.

* cited by examiner

| RATE MATCHING RATIO | WEIGHTING COEFFICIENT $\alpha$ |
|---|---|
| 1 | 2 |
| 0.8 | 2.8 |

NORMALIZING DEVICE AND METHOD, PROGRAM, RECORDING MEDIUM ON WHICH THE PROGRAM IS RECORDED AND COMMUNICATION TERMINAL FOR NORMALIZING DATA

TECHNICAL FIELD

The present invention relates to normalization of data to be inputted to a turbo decoder for turbo coding, which is a form of error correcting coding.

BACKGROUND ART

Conventionally, error correction has been made possible by coding information signals and then decoding. Various methods are available for such an error correction. When the error correction is used for reliable wireless communications, a lower limit in a signal to noise ratio (Eb/No, where Eb is power per bit and No is noise power per 1 Hz), at which the error correction would be possible for information signals at a prescribed error rate, is a critical issue.

The lower limit in the signal to noise ratio, at which error correction would be possible, is theoretically determined by the Shannon's Theorem. Turbo coding is a method of error correction that offers a lower limit in the signal to noise ratio that is fairly close to a limit that would be determined by the Shannon's Theorem for error correction. The turbo coding was first introduced in a reference "C. Berrou, A. Glavieux, and G Montorsi; "New Shannon Limit Error Correcting Coding and Decoding: Turbo Codes (1)," Proc. of ICC'93 (Geneva, Switzerland), pp. 1064–1070". The turbo coding has gained a lot of attention because of a significantly high performance.

Input signals for a turbo decoder must be normalized. A reference "C. Berrou, A. Glavieux and member, IEEE: "Near Optimum Error Correcting Coding and Decoding: Turbo-Codes," Proc. of IEEE October, 1996, Vol. 44, No. 10, pp. 1261–1271" mentions a use of log-likelihood space ratios (LLR) for input signals to the turbo decoder. The LLR is defined as follows:

$$\Lambda(d_K) = \log \frac{P(y_k|1)}{P(y_k|0)} \quad (1)$$

Specifically, the LLR is defined as follows for an AWGN channel.

$$\Lambda(d_k) = 4 \frac{E_s}{N_o} \frac{y_k}{\sqrt{E_s}} \quad (2)$$

Here, Es is energy per symbol (1 bit after turbo coding); and No is noise power per 1 Hz. As shown in Equation 2, in order to obtain the LLR, No (noise power per 1 Hz) must be obtained. It means that a noise variance being added to a single piece of information must be estimated, and a receiving quality must be measured.

However, a size of a circuit for measuring the receiving quality would not be negligible in comparison to a size of a circuit for an entire decoder. In other words, the size of the circuit for the entire decoder would become larger.

If input signals to the turbo decoder were not to be normalized, then the use of the LLR can be avoided, and an enlargement of the circuit size can be inhibited. However, because trends in levels of the input signal into the turbo decoder could change significantly, it would be difficult to achieve a level of quality of the communications that would be of practical use, if the normalization were not to be performed.

A task of the present invention, therefore, is to provides, for example, a normalizing apparatus for normalizing the input signals to the turbo decoder without increasing the size of the circuit by too much.

DISCLOSURE OF THE INVENTION

The present invention is related to a normalizing apparatus. The normalizing apparatus of the present invention includes a means of input data averaging and a means of division. The means of input data averaging outputs an averaged data, which is an average of turbo coded input signals. The means of division outputs a normalized data, which is a value obtained by dividing the input signal by the averaged data.

According to the invention constructed as above, the normalization is made possible by dividing the turbo coded input signals by the average data. Furthermore, increases in the circuit size are minimized, because the circuit size would be relatively small scaled.

Furthermore, the normalizing apparatus, according to the present invention, may preferably include a means of weighting and a means of determining coefficients for weighting. The means of weighting outputs by multiplying the normalized data and prescribed coefficients. The means of determining the weighting coefficients determines the prescribed coefficients based on a ratio between the number of input data and the number of output data in a rate matching for the input signals.

For example, if a W-CDMA communications format is used, there is a relationship between an overall input signal level within a single frame and a rate matching ratio, which is a ratio between the number of input data and the number of output data in the rate matching of the input signals. Therefore, the overall level for the input signals within the single frame may be maintained at a constant level, if the prescribed coefficients, which are used for the weighting, were determined based on the rate matching ratio.

BEST MODES FOR CARRYING OUT THE INVENTION

An embodiment of the present invention will be described below by referring to diagrams.

Figure 1:
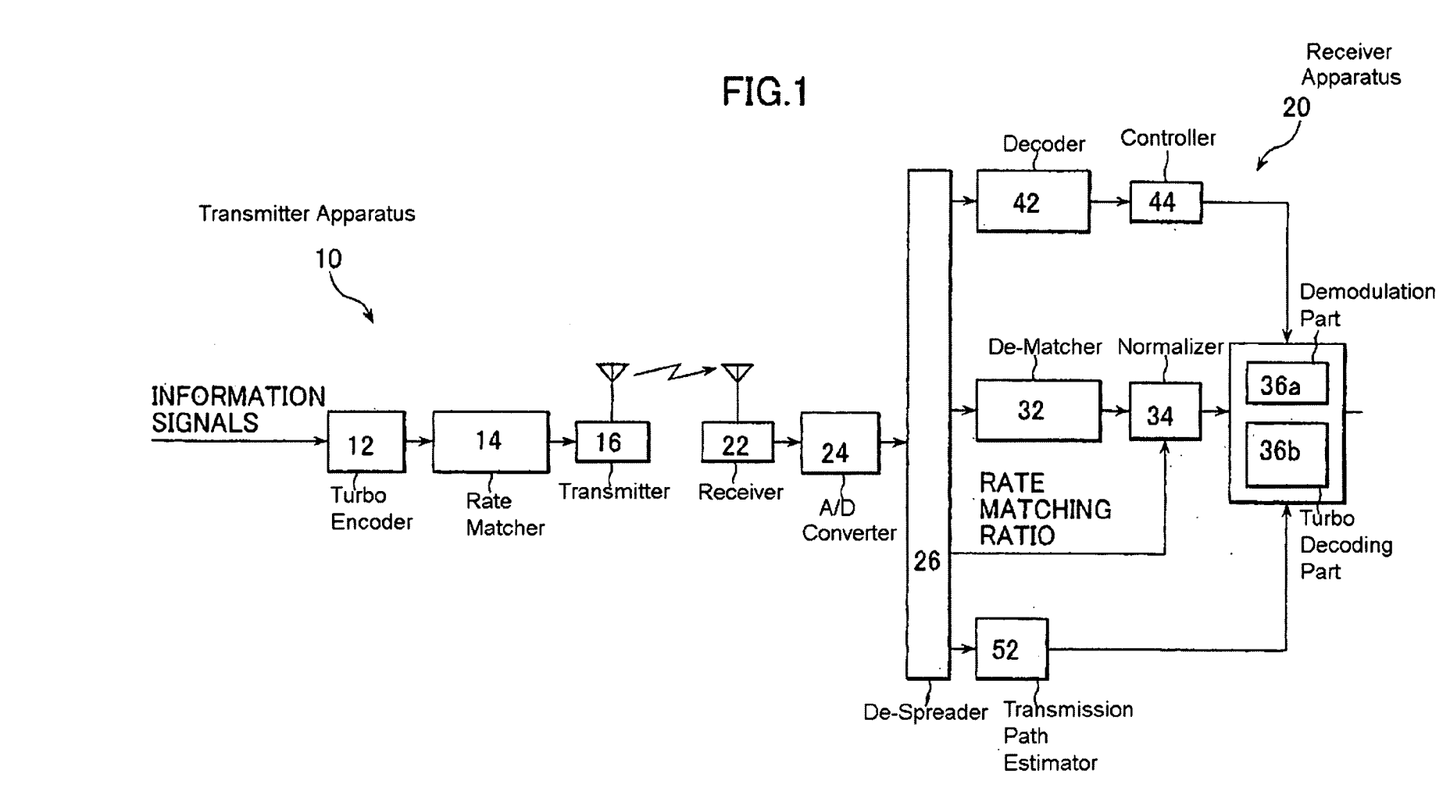
FIG. 1 is a block diagram showing a construction of a transmitter apparatus 10 and a receiver apparatus 20 according to an embodiment of the present invention.

FIG. 1 is a block diagram showing a transmitter apparatus 10 and a receiver apparatus 20 according to the embodiment of the present invention.

The transmitter apparatus 10 includes a turbo coding part 12, a rate matching part 14, and a transmitter part 16.

Figure 2:
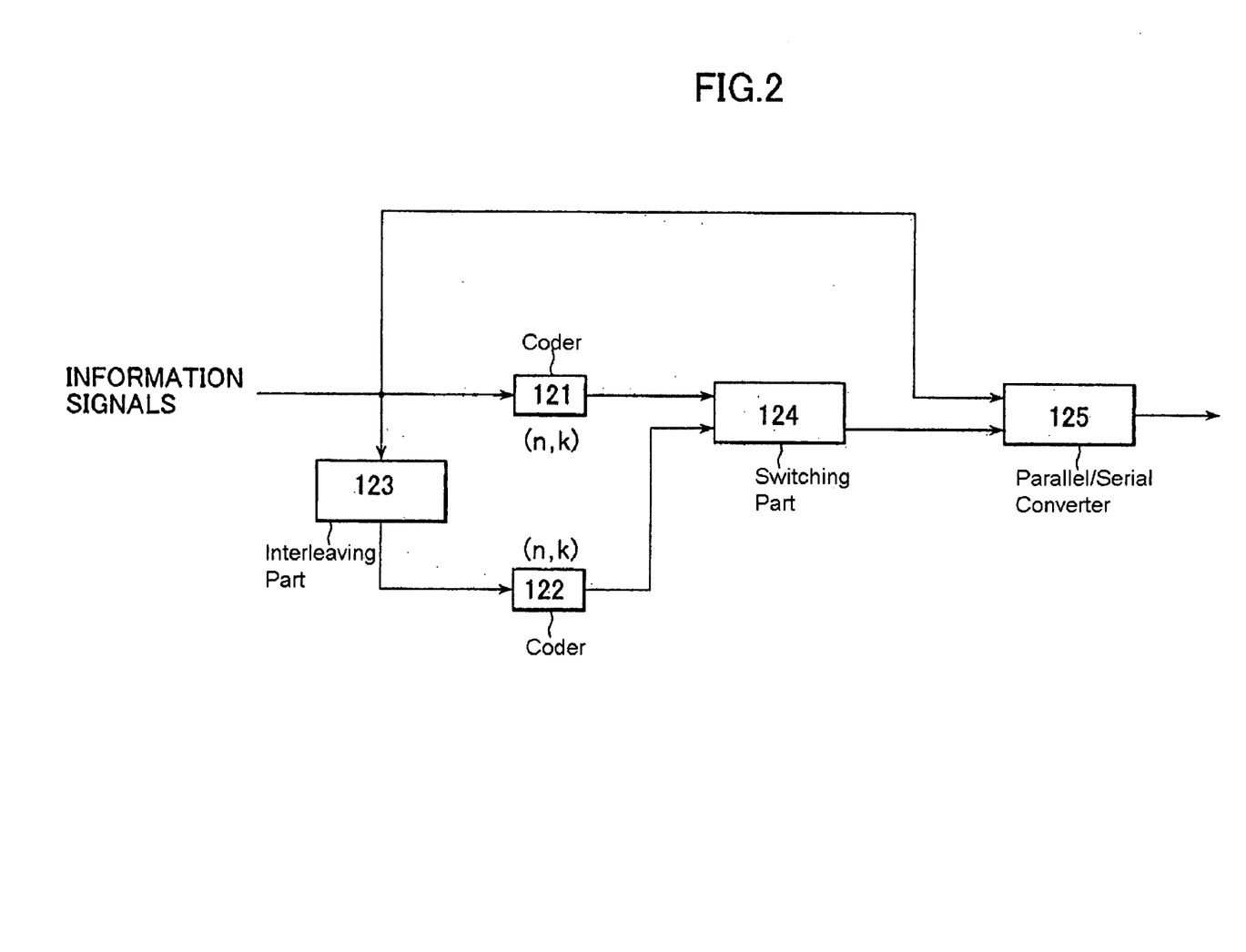
FIG. 2 is a block diagram showing a construction of a turbo coding part 12.

The turbo coding part 12 performs turbo coding on information signals that are to be transmitted to the receiver apparatus 20. The turbo coding is a method of coding, which was originally introduced in a reference "C. Berrou, A. Glavieux and G Montorsi: 'Near Shannon Limit Error-Correcting Coding and Decoding: Turbo—Codes (1)' Proc. of ICC '93 (Geveva, Switzerland), pp. 1064–1070." FIG. 2 shows a construction of the turbo coding part 12.

The turbo coding part 12 includes coders 121, 122, an interleaving part 123, a switching part 124, and a parallel/serial converter part 125. The turbo coding will only be described briefly here, because a description is available in the reference mentioned above.

The coder 121 codes information signals with structural convolutional coding codes (n, k) and provides an output to the switching part 124. The coder 122 codes an output from the interleaving part 123 with the structural convolutional coding code (n, k) and provides an output to a switching part 124. The interleaving part 123 interleaves the information signals at prescribed sizes and provides an output to the coder 122. The switching part 124 switches between the outputs from the coders 121, 122, in accordance with an interleaving performed by the interleaving part 123, and provides an output. The parallel/serial converter part 125 receives the output (coding bits) from the switching part 124 and the information signals (uncoded bits), performs switches (parallel/serial conversion), and provides an output. The output from the parallel/serial converter part 125 is an output of the turbo coding part 12.

Back in FIG. 1, the rate matching part 14 receives the output from the turbo coding part 12 and performs a rate matching. Then, the rate matching part 14 provides the information signals with adjusted data block sizes as an output. Furthermore, the rate matching part 14 provides a ratio of the number of output data/the number of input data in the rate matching of the input signals, which is called a rate matching ratio, and provides as an output. By the way, based on a definition for the rate matching ratio, the following would be true, as shown in a table below.

| Rate Matching Ratios | Relationships Between Numbers of Input and Output Data in Rate Matching |
|---|---|
| Rate Matching Ratios > 1 | Number of Input Data < Number of Output Data |
| Rate Matching Ratios = 1 | Number of Input Data = Number of Output Data |
| Rate Matching Ratios < 1 | Number of Input Data > Number of Output Data |

The rate matching is an adjustment of data block sizes of signals that have been turbo coded into data block sizes that can be transmitted and received through a transmission path. A reference "3GPP, 'TS 25.212 Ver 3.5.0 Multiplexing and Channel Coding (FDD)' 2001" describes an example of a communications systems relying on turbo coding and explains the rate matching.

The transmitter part 16 performs modulations, spreading, and D/A conversions, as required, on the output information signals, which have been turbo coded and rate matched, from the rate matching part 14; pilot signals; and control signals, which indicates a modulation method, and transmits to the receiver apparatus 20. By the way, signals which indicate a rate matching ratio are also transmitted independently from these signals.

The receiver apparatus 20 includes a receiver part 22, an A/D conversion part 24, a de-spreading part 26, a rate de-matching part 32, a normalizing apparatus 34, a data demodulation/decoding part 36, a control data demodulation/decoding part 42, a controller part 44, and a transmission path estimation part 52.

The receiver part 22 receives signals, which include the information signals, the pilot signals, and the control signals that have been transmitted by the transmitter apparatus 10. The received signals are called received signals (coded signals) and are broken into frame units. The received signals include the information signals, the pilot signals, and the control signals and have been spread and modulated by the transmitter part 16 in the transmitter apparatus 10. By the way, the control signals specify a modulation method. For example, if the control signals indicate that the received signals have gone through a QPSK modulation at a base station, then a demodulation method must be QPSK. In other words, the control signals indicate the QPSK demodulation method. By the way, the receiver part 22 also receives signals that indicate the rate matching ratio, which are separate from the received signals.

The A/D conversion part 24 digitizes the received signals and the signals that indicate the rate matching ratio. The de-spreader part 26 de-spreads the received signals, that have been digitized, and provides the information signals, the pilot signals, and the control signals as an output. By the way, the signals that indicate the rate matching ratio are also de-spread and provided as an output.

The rate de-matching part 32 adjusts the data block sizes of the information signals received by the receiver apparatus 20 into data block sizes that can be processed by a turbo coding part 36b in the data demodulating/decoding part 36, and provides an output to the normalizing apparatus 34. In other words, the rate de-matching part 32 performs a function that is a reverse of the rate matching part 14.

Figure 3:
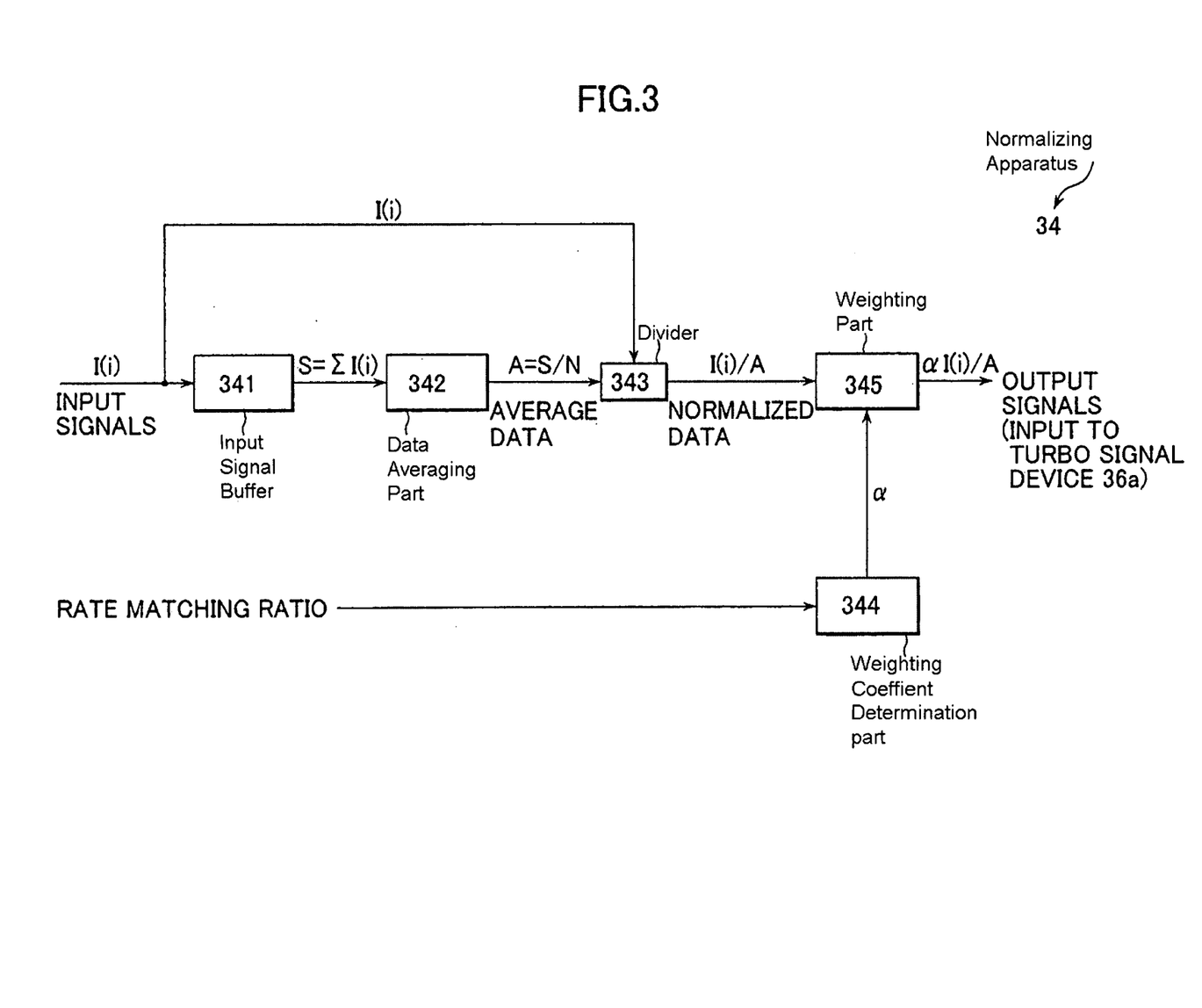
FIG. 3 is a block diagram showing a construction of a normalizing apparatus 34.

The normalizing apparatus 34 normalizes input signals from the rate de-matching part 32 and provides an output to the data demodulation/decoding part 36. FIG. 3 shows a construction of the normalizing apparatus 34. The normalizing apparatus 34 includes an input signal buffer 341, an input data averaging part 342, a divider 343, and a weighting coefficient determination part 344, and a weighting part 345. By the way, the input signal buffer 341, the input data averaging part 342, and the divider 343 make up the means of normalization.

The input signal buffer 341 receives prescribed N pieces (for example, approximately 100 pieces) of input signals I(i) and provides a sum S (=ΣI(i)) as an output. The input data averaging part 342 divides the sum S (=ΣI(i)) by the prescribed number N to obtain average data A (=S/N). The average data should preferably be obtained in frame units. The divider 343 divides the input signals I(i) by the average data A and provides normalized data I(i)/A. Here, the normalized data should preferably be data resulting from performing an additional weighting on the normalized data I(i)/A. Then, the weighting coefficient determination part 344 determines the weighting coefficients α based on the rate matching ratio received by the receiver apparatus 20. The weighting part 345 multiplies the normalized data I(i)/A and the weighting coefficient a and provides an output. The output from the weighting part 345 is called weighted signals, which are an output from the normalizing apparatus 34.

Figure 4:
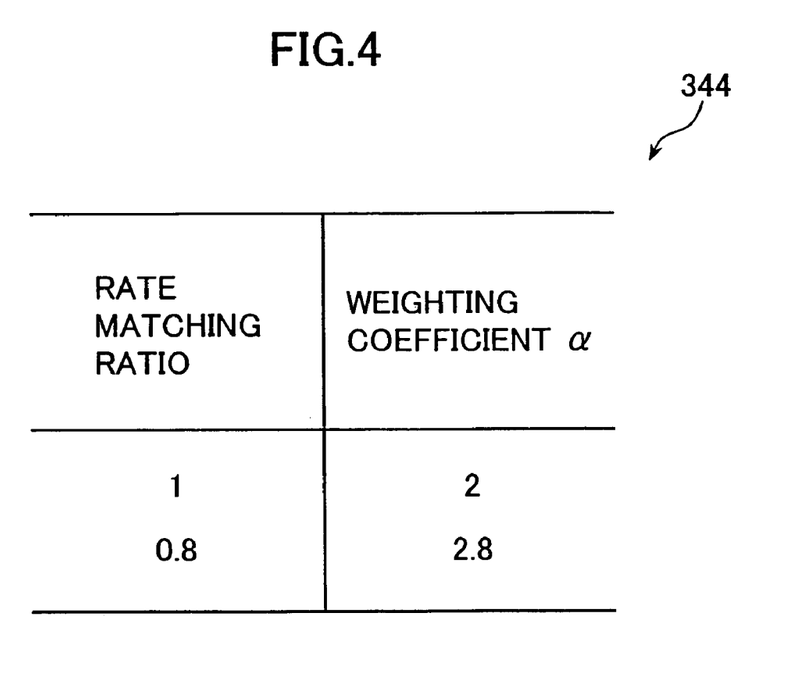
FIG. 4 is a diagram describing a method of determining a weighting coefficient α.

By the way, a method of determining the weighting coefficient α will be described by referring to FIG. 4. As shown in FIG. 4, the weighting coefficient determination part 344 selects in frame units the weighting coefficient α, that corresponds with the rate matching ratio, by referring to a table that correlates the rate matching ratio with the weighting coefficient α. Here, the weighting coefficient a should preferably be larger, when the rate matching ratio is smaller.

The rate matching ratio is the ratio between the number of output data and the number of input data in the rate matching of the input signals. Therefore, a smaller rate matching ratio means a smaller number of output data from the rate matching part 14. Hence, the number of output data would be larger in the rate de-matching performed at the rate de-matching part 32. Here, when the W-CDMA communications format is used, zero (0) is to be supplemented in order to increase the number of output data in rate de-matching. However, when zero (0) is supplemented, a level for the entire single frame becomes lower than the original level. Therefore, when the rate matching ratio is smaller, a larger weighting coefficient α is multiplied in order to make the number of output data larger. As a result, the amount of zero (0) supplement can be suppressed, and the level for the entire single frame is maintained almost at the original level.

The data demodulation/decoding part 36 demodulates the normalized information signals, which are the output from the normalizing apparatus 34, with the demodulation method specified by the control signals, and performs a turbo decoding. By the way, the data demodulation/decoding part 36 performs a phase correction based on an amount of phase rotation calculated by the transmission path estimation part 52. Furthermore, the data demodulation/decoding part 36 includes a demodulation part 36a and the turbo decoding part 36b.

Figure 5:
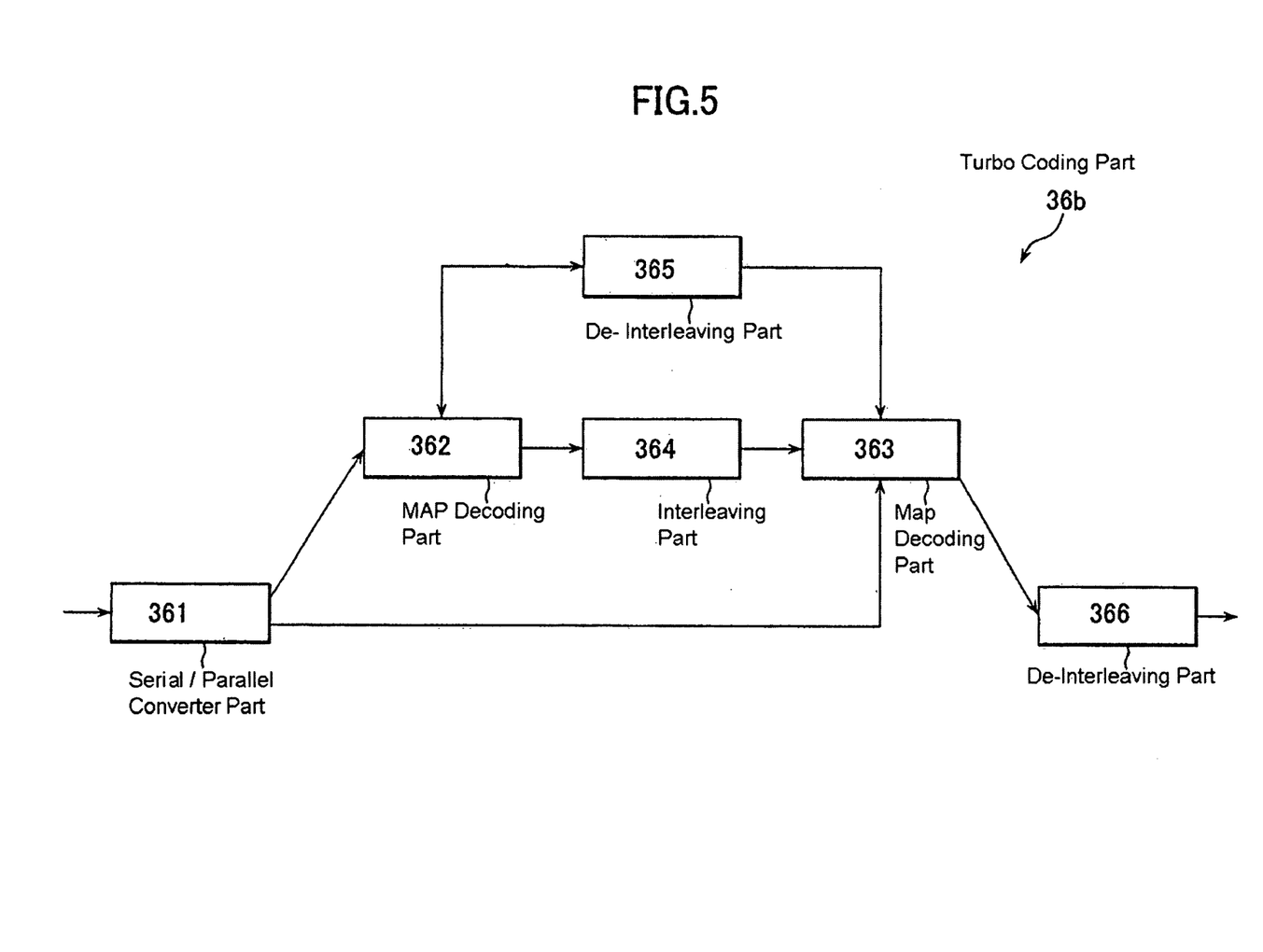
FIG. 5 is a block diagram showing a construction of a turbo coding part 36b.

The demodulation part 36a demodulates the information signals with the demodulation method (for example, QPSK, 16QAM, 64QAM) specified by the control signals. The turbo decoding part 36b turbo decodes the information signals, as shown in FIG. 5. The turbo decoding part 36b includes a serial/parallel conversion part 361, MAP decoding parts 362, 363, an interleaving part 364, and de-interleaving parts 365, 366.

The serial/parallel conversion part 361 performs a serial/parallel conversion on the normalized information signals and provides an output to the MAP decoding parts 362, 363.

The MAP decoding will be described here. When coding has been performed, and a coding word wj is transmitted, a correct decoding would be possible when a received word y falls within a decoding area Rj of the coding word wj. Therefore, a probability Pc for a correct decoding in this instance would be:

$$P_c(wj) = \sum_{j=1}^{M} (P(wj) \cdot P_c(wj)) = \sum_{j=1}^{M} \sum_{y \in Rj} P(wj) \cdot P(y|wj) \quad (3)$$

if a probability at which each coding word is transmitted is P(wj). In Equation 3, a coupling probability P(wj, y)=P(wj) * P(y|wj) should be maximized. In the end, it should be assumed that the coding word that maximizes the conditional probability P(y|wj), with respect to a given received word y, has been transmitted. The conditional probability P(y|wj) is called a posteriori probability, and a decoding based on an assumption that a coding word that maximizes this probability, has been transmitted, is called a maximum a posteriori probability decoding (MAP decoding). The MAP decoding is described in detail in "L. R. Bahl, J. Cocke, F. Jelinek, and J. Raviv,: 'Optimal Decoding of Linear Codes for Minimizing Symbol Error Rate,' IEEE Trans. Inform. Theory, Vol. IT-20, pp. 284–287, 1974."

The MAP decoding part 362 MAP-decodes the output from the serial/parallel conversion part 361 and the output from the interleaving part 365 and provides an output to the interleaving part 364. The MAP decoding part 363 MAP-decodes the output from the serial/parallel conversion part 361 and the output from the interleaving part 364 and provides an output to the de-interleaving parts 365 and 366. The interleaving part 364 rearranges the output from the MAP decoding part 362 with a length corresponding with the interleaving performed by the interleaving part 123 during coding and provides an output. The de-interleaving part 365 performs an operation, that is a reverse of the interleaving part 364, on the output from the MAP decoding part 363. The de-interleaving part 366 performs an operation that is a reverse of the interleaving part 364 on the output from the MAP decoding part 363 and provides an output. The output from the de-interleaving part 366 is an output from the turbo coding part 36b.

Back in FIG. 1, the control data demodulation/decoding part 42 demodulates and decodes the control signals, which are the output from the de-spreading part 26, with a predetermined format. For example, if it has been predetermined that the control signals should be QPSK modulated, then the demodulation would be in the QPSK format.

The controlling part 44 reads out the demodulation method specified by the control signals, which are the output from the control data demodulation/decoding part 42. Then, the controlling part 44 controls the data demodulation/decoding part 36 in order to perform in the specified demodulation format.

Figure 6:
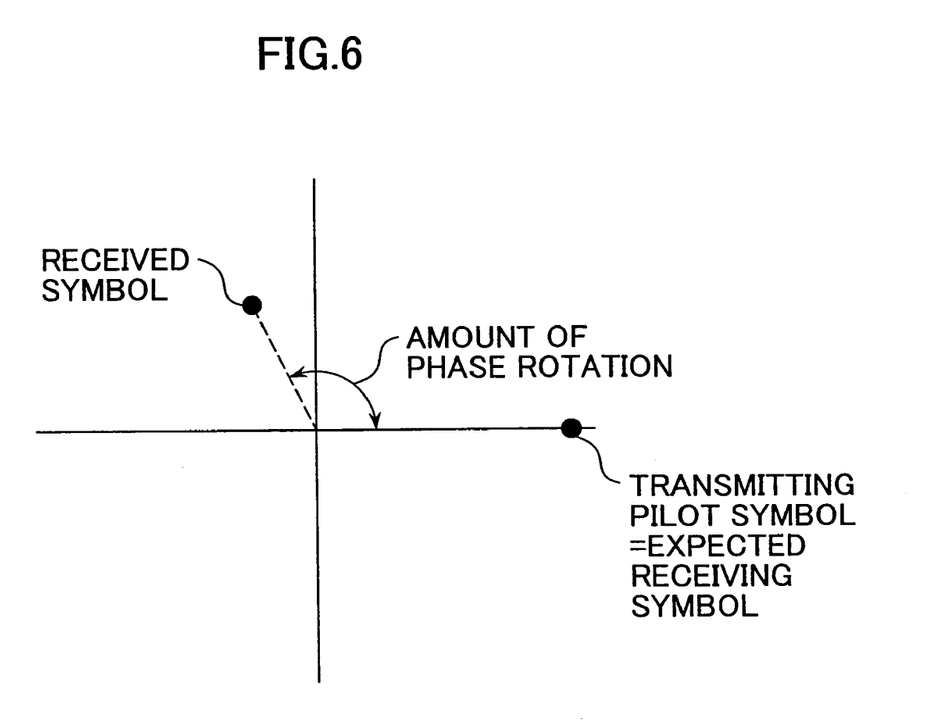
FIG. 6 is a diagram showing an amount of phase rotation.

The transmission path estimation part 52 obtains the amount of phase rotation based on the pilot signal, which is an output from the de-spreading part 26. As shown in FIG. 6, the amount of phase rotation is a phase difference between the received signal and received signal that are expected. The amount of phase rotation is determined by taking into account an effect of noise components on the pilot channel and by obtaining an average for M pieces of pilot symbols. The transmission path estimation part 52 transmits the amount of phase rotation to the data demodulation/decoding part 36.

Next, an operation of the embodiment of the present invention will be described.

Firstly, the information signals are turbo coded by the turbo coding part 12. The information signals, that have been turbo coded, are rate matched by the rate matching part 14.

In other words, the information signals are converted into data block sizes suitable for communications. The information signals are modulated and spread, along with the pilot signals and the control signals, which indicate the modulation method, and are transmitted from the transmitter part 16 to the receiver apparatus 20. The rate matching ratio is also transmitted to the receiver apparatus 20 separately.

The receiver part 22 of the receiver apparatus 20 receives the signals transmitted by the transmitter apparatus 10. These received signals are digitized by the A/D conversion part 24 and de-spread by the de-spreading part 26. The control signals, which are an output from the de-spreading part 26, are demodulated and decoded by the control data demodulation/decoding part 42 and sent to the controller part 44. The controller part 44 reads out the demodulation format from the control signals. Furthermore, the pilot signals, which are the output from the de-spreading part 26, are used by the transmission path estimation part 52 for obtaining the amount of phase rotation.

The information signals, which are the output from the de-spreading part 26, are rate de-matched by the rate de-matching part 32 and adjusted into block sizes that are suited for turbo decoding. The output signals from the rate de-matching part 32 are provided as the input signals I(i) to the normalizing apparatus 34.

The input signal buffer 341 obtains the sum S (=ΣI(i)) for the prescribed N pieces of input signals I(i), and the input data averaging part 342 divides the sum S by the prescribed number of pieces N to obtain the average data A=S/N. Furthermore, the divider 343 divides the input signals I(i) by the average data A to obtain the normalized data I(i)/A. The weighting part 345 weights the normalized data I(i)/A by multiplying with the weighting coefficient α and provides an output. By the way, the weighting coefficient α is determined by the weighting coefficient determination part 344 based on the rate-matching ratio.

Here, a circuit size for realizing this normalizing apparatus 34 is small, because a receiving quality does not need to be measured.

The data demodulation/decoding part 36 demodulates and turbo-decodes the output from the normalizing apparatus 34 with a demodulation format read out by the controller part 44. At this time, the amount of phase rotation obtained by the transmission path estimation part 52 is used for a phase correction.

According to the embodiment of the present invention, the normalized data I(i)/A is obtained by dividing the input signals I(i), which have been turbo coded, by the average data A=S/N. Because the receiving quality does not need to be measured, the size of the circuit for the normalizing apparatus 34 is relatively small, and an increase in the circuit size can be inhibited.

Furthermore, when, for example, the W-CDMA communications format is used, the level for the entire single frame tends to be small, when the rate-matching ratio is small. In the embodiment of the present invention, the smaller the rate-matching ratio, the larger will the weighting coefficient determination part 344 make the weighting coefficient α. Furthermore, because the weighting part 345 multiplies the normalized data I(i)/A with the weighting coefficient α, the level for the entire single frame of the input signals is maintained at a fairly constant level.

Figure 7:
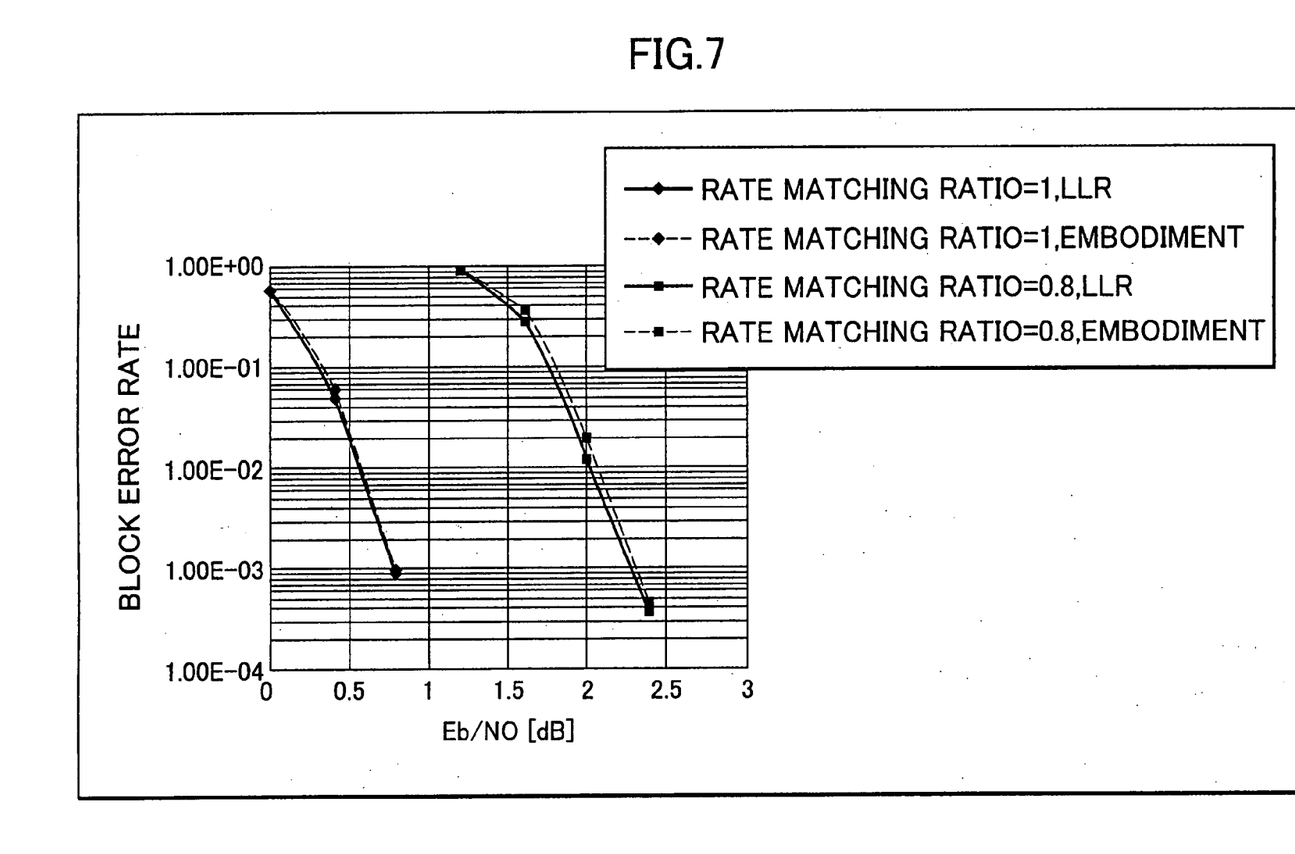
FIG. 7 is a diagram showing lengths of pilot signals used for determining an average.

By the way, FIG. 7 compares block error rates (in data block units for coding and decoding), when the LLR is used, and with the embodiment of the present invention. The quality levels resulting from using the LLR and from the embodiment of the present invention are approximately the same.

Furthermore, the present invention is suited for application on a coding method, in which a power level of input signals into the decoder somehow affects decoding characteristics (error rates). Such a decoding method is, for example, the Log-MAP decoding. Simply stated, the Log-MAP decoding is a decoding method of selecting a larger value of two Branch Metric values and adding a correction term. It would not be necessary to perform the normalization process of the present invention for the Max-Log-MAP decoding, with which a larger value is simply selected out of the two Branch Metric values.

A reason for a significant change in the decoding characteristics caused by the signal power in the Log-MAP decoding will be described next. In other words, the correction term in the Log-MAP decoding is stored in a reference table within a decoder. When the signal power is not set appropriately, an inappropriate portion of the reference table would be read out, and the decoding characteristics can change significantly.

Furthermore, the above-described embodiment can be realized as follows. A media accessing apparatus in a computer, which includes a CPU, a hard disk, a flash memory, and a media accessing apparatus (for example, a floppy disk, a CD-ROM, or a memory stick), accesses a medium that stores a program, that implements the above-mentioned various parts, and installs on a hard disk or a flash memory. The above-described functions can be realized with such a method.

According to the present invention, the normalization is accomplished by dividing the turbo coded input signals by the average data. Furthermore, because the circuit size is relatively small, an increase in the circuit size is inhibited.

The invention claimed is:

1. A normalizing apparatus comprising:
    means of data averaging for outputting an average of turbo coded input signals as an average data;
    means of division for outputting a value obtained by dividing said input signals by said average data as a normalized data; and
    means of weighting for multiplying said normalized data by a prescribed coefficient and providing an output,
    said normalizing apparatus further comprising:
    means of weighting coefficient determination for detennining said prescribed coefficient based on a ratio between the number of input data and the number of output data in a rate-matching of said input signals.

2. A receiver comprising:
    the normalizing apparatus according to claim 1, and
    means of turbo decoding for turbo decoding an output from said normalizing apparatus.

3. A method of normalization comprising:
    an averagnig step of data averaging and outputting an average of turbo coded input signals as an average data;
    a division step of dividing and outputting a value obtained by dividing said input signals by said average data as a normalized data; and
    a weighting step of weighting for multiplying said normalized data by a prescribed coefficient and providing an output,
    said normalizing method further comprising:
    a determining step of weighting coefficient determination for determining said prescribed coefficient based on a ratio between the number of input data and the number of output data in a rate-matching of said input signals.

4. A program to be executed by a computer for performing:
    a processing step of data averaging for outputting an average of turbo coded input signals as an average data;
    a processing step of division for outputting a value obtained by dividing said input signals by said average data as a normalized data; and
    a processing step of weighting for multiplying said normalized data by a prescribed coefficient and providing an output,
    said program further causing said computer for performing:
    a processing step of weighting coefficient determination for determining said prescribed coefficient based on a ratio between the number of input data and the number of output data in a rate-matching of said input signals.

5. A recording medium that can be readable by a computer, which stores a program to be executed by the computer for performing:
- a processing step of data averaging for outputting an average of turbo coded input signals as an average data;
- a processing step of division for outputting a value obtained by dividing said input signals by said average data as a normalized data; and
- a processing step of weighting for multiplying said normalized data by a prescribed coefficient and providing an output,
- said program further causing said computer for performing;
- a processing step of weighting coefficient determination for determining said prescribed coefficient based on a ratio between the number of input data and the number of output data in a rate-matching of said input signals.

6. A communications terminal apparatus comprising:
- means of receiving for receiving coded signals separated into frame units;
- means of normalization for calculating an average value for signal levels for said coded signals, normalizing said coded signals and generating normalized signals;
- means of weighting coefficient determination for generating a weighting coefficient for said frame unit;
- means of weighting for multiplying said normalized signals and said weighting coefficient, and generating weighted signals; and
- means of decoding for decoding said weighted signals,
- wherein said means of normalization calculates a signal level average value for the coded signals in said frame unit;
- a rate-matching process is performed on said coded signals; and
- said means of weighting coefficient determination determines said weighting coefficient based on a ratio between the number of input data and the number of output data in said rate-matching process.

7. The communications terminal apparatus of claim 6 wherein
- said coded signals are turbo coded signals; and
- said means of decoding performs a turbo decoding process on said weighted signals.

8. The communications terminal apparatus of claim 7 wherein said turbo decoding process comprises a Log-MAP decoding process.

* * * * *